(12) United States Patent
Lau et al.

(10) Patent No.: US 9,516,390 B2
(45) Date of Patent: Dec. 6, 2016

(54) SCALING VIDEO DELIVERY

(71) Applicant: Ramp Holdings, Inc., Boston, MA (US)

(72) Inventors: Raymond Lau, Charlestown, MA (US); Erik Herz, Framington, CT (US)

(73) Assignee: Ramp Holdings, Inc., Boston, MA (US)

( * ) Notice: Subject to any disclaimer, the term of this patent is extended or adjusted under 35 U.S.C. 154(b) by 0 days.

(21) Appl. No.: 14/597,247

(22) Filed: Jan. 15, 2015

(65) Prior Publication Data

US 2016/0212496 A1 Jul. 21, 2016

(51) Int. Cl.
| | |
|---|---|
| *H04N 7/16* | (2011.01) |
| *H04N 7/173* | (2011.01) |
| *H04N 21/61* | (2011.01) |
| *H04N 21/2187* | (2011.01) |
| *H04N 21/845* | (2011.01) |
| *G11B 27/10* | (2006.01) |
| *H04N 21/6334* | (2011.01) |
| *H04N 21/647* | (2011.01) |
| *H04N 21/24* | (2011.01) |
| *H04N 21/4425* | (2011.01) |
| *H04N 21/63* | (2011.01) |
| *H04N 21/6405* | (2011.01) |
| *H04N 21/643* | (2011.01) |
| *H03M 13/29* | (2006.01) |
| *H03M 13/15* | (2006.01) |

(52) U.S. Cl.
CPC ........... *H04N 21/6125* (2013.01); *G11B 27/10* (2013.01); *H03M 13/2906* (2013.01); *H04N 21/2187* (2013.01); *H04N 21/2404* (2013.01); *H04N 21/4425* (2013.01); *H04N 21/631* (2013.01); *H04N 21/6334* (2013.01); *H04N 21/6405* (2013.01); *H04N 21/6473* (2013.01); *H04N 21/64322* (2013.01); *H04N 21/8456* (2013.01); *H03M 13/1515* (2013.01)

(58) Field of Classification Search
CPC .............. H04N 21/2187; H04N 21/222; H04N 21/2343; H04N 21/23473; H04L 1/004; H04L 1/0618
USPC ................................. 725/116, 119, 149, 151
See application file for complete search history.

(56) References Cited

U.S. PATENT DOCUMENTS

| | | | | |
|---|---|---|---|---|
| 4,494,234 A | * | 1/1985 | Patel ................... | H03M 13/151 714/757 |
| 5,537,403 A | * | 7/1996 | Cloonan ............. | H04L 12/5601 370/352 |
| 2012/0124179 A1 | * | 5/2012 | Cappio ................ | H04L 65/104 709/219 |

* cited by examiner

*Primary Examiner* — Dominic D Saltarelli
(74) *Attorney, Agent, or Firm* — Chapin Intellectual Property Law, LLC

(57) ABSTRACT

Methods and apparatus, including computer program products, for scaling video delivery. A method includes, in a corporate network comprising at least a first server linked to a computing system having a video player, receiving an output of a chunked video protocol in the first server, sending the output from the first server via a multicast to a receiver and, in the receiver, processing the output to enable consumption by the video player.

17 Claims, 4 Drawing Sheets

| | | | | | |
|---|---|---|---|---|---|
| String | A | B | C | | |
| Reed-Solomon (1 error allowed) | D | E | F | G | H |
| Corrupted data | D | *D* | F | G | H |
| Lost data Where is lost codeword? (cannot recover) | D | F | G | H | |

Where is lost codeword?
_ D F G H ?
D _ F G H ?
D F _ G H ?
D F G H _ ?

FIG. 2

| | |
|---|---|
| String | A B C |
| Reed-Solomon coded with sequence number | 1D 2E 3F 4G 5H |
| Lost data | 1D 3F 4G 5H |
| To be decoded | D _ F G H |

FIG. 3

SCALING VIDEO DELIVERY

BACKGROUND OF THE INVENTION

The invention generally relates computer systems and computer executed methods, and more specifically to scaling video delivery.

In general, video is widely acknowledged as an Internet Protocol (IP) network bandwidth consumer. Even for a relatively low bandwidth standard definition, 750 kilobits per second is not an unusual data rate. High definition video is typically 1500 kilobits per second or more.

In general, with unicast network video transmission, each viewer requires his or her own video stream. In particular, live video poses an outsized challenge because a company may have tens of thousands of users watching the live video, with hundreds of users watching from the same building. Even with caching at the building level and one gigabit (Gb) Ethernet wiring, one hundred users can effectively tie up more than half of the usable IP bandwidth. More layers of caches can be added, but with that comes more complexity and cost.

Multicast network transmission is one typical solution to this problem. In a multicast transmission, the same stream is shared by multiple users who happen to be using the same network device. The traditional way of doing IP multicast for video is to send Moving Picture Experts Group Transport Stream (MPEG TS) packets (c.f. ISO/IEC standard 13818-1 or ITU-T Rec. H.222.0) via User Datagram Protocol (UDP) multicast. However, there are several drawbacks to this approach.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides methods and apparatus, including computer program products, for scaling video delivery.

In general, in one aspect, the invention features a method including, in a corporate network comprising at least a first server linked to a computing system having a video player, receiving an output of a chunked video protocol in the first server, sending the output from the first server via a multicast to a receiver and, in the receiver, processing the output to enable consumption by the video player.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The invention will be more fully understood by reference to the detailed description, in conjunction with the following figures, wherein:

FIG. 2 is an exemplary table.
FIG. 3 is an exemplary table.

DETAILED DESCRIPTION

Figure 1:
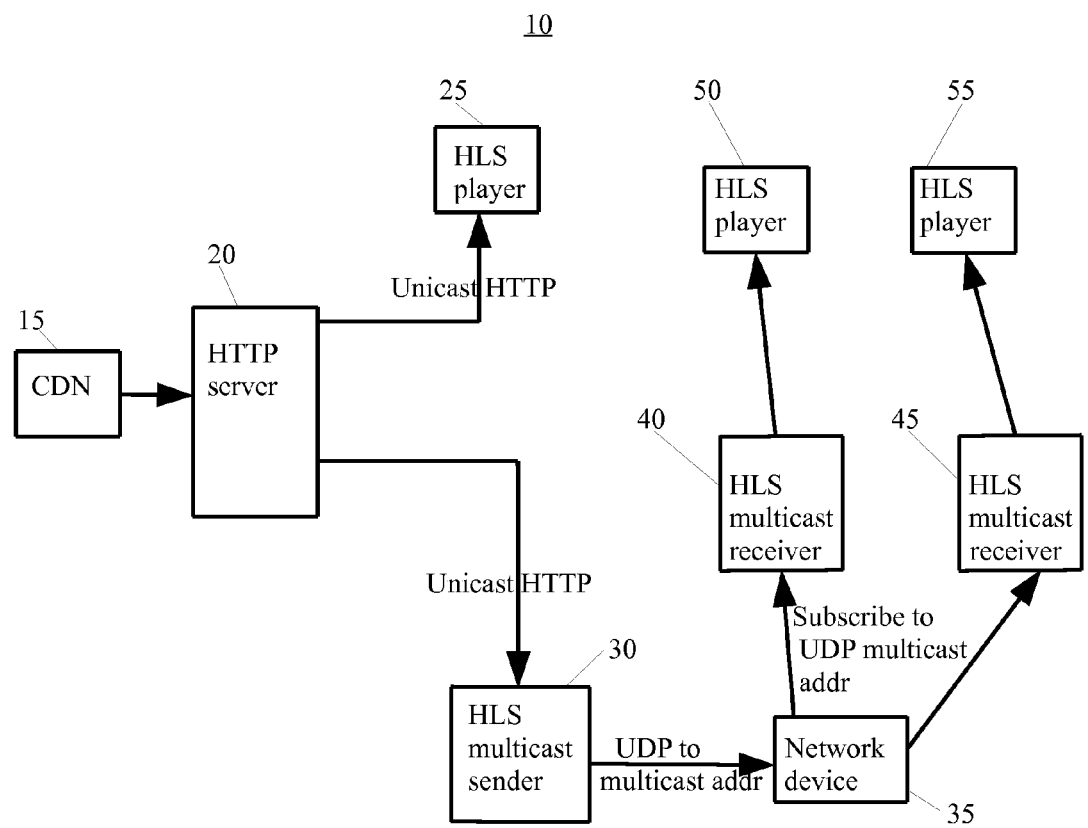
FIG. 1 is a block diagram of an exemplary network.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component," "system," "platform," and the like can refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

In addition, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

In general, video is digitized and encoded with a codec such as H.264. The encoded video is then packaged into a container format, such as, for example, MPEG-4 (MP4) or Apple® QuickTime Movie (MOV). Finally, a wire protocol is used to transmit the video over the Internet. In general, a "wire protocol" is a mechanism for transmitting data from point A to point B in a network. A wire protocol defines the conversational byte sequences that pass over a network to make things happen.

The description below concentrates primarily on the wire protocol.

In general, wire protocols span the spectrum from true streaming on one extreme to file download at the other extreme. In a full streaming protocol such as Real Time Messaging Protocol (RTMP) or Real Time Streaming Protocol (RTSP), a sender and a receiver are continuously connected with data sent as a continuous stream, for example, one frame at a time. At the other extreme are file-based protocols such as Hypertext Transfer Protocol (HTTP) and Hypertext Transfer Protocol Secure (HTTPS) progressive download. Here, the video asset is treated as an entire file and a protocol suitable for file transfers such as HTTP is used.

One disadvantage of a file based protocol for live video is that it cannot be easily used for live video because live video cannot be contained within a file as new data are constantly added to the end. Thus, file-based protocols are primarily limited to video on demand. A full streaming protocol works well for live streaming, however it too has disadvantages. The primary disadvantages are that video-specific support is required to cache and accelerate delivery on the Internet and that seeking backwards (e.g., live DVR functionality) requires great protocol complexity and again, specific support along the various transmission hops on the Internet for cached/accelerated delivery.

A third class of protocols is referred to as "chunked HTTP" (also known as adaptive HTTP streaming protocols or HTTP pseudo-streaming protocols). Here, the video stream is divided into "chunks" of a small duration, e.g., 4 to 20 seconds. Each chunk is then treated as a normal file and delivered via HTTP. Note that when we reference HTTP, we also intend to include the HTTPS variant.

Chunked HTTP takes better advantage of widely deployed Internet infrastructures, such as content delivery networks (CDNs) like Akamai® and Amazon® CloudFront, which know how to handle HTTP file delivery well. Chunked HTTP also has better compatibility with mobile devices (e.g., smartphones and tablets), where higher latencies make it more difficult to support full streaming. In addition, chunked HTTP has an ability to support different (adaptive) bitrates to different users and an ability to easily support digital video recorder (DVR) seek functionality, as that is simply skipping to load and starting from a different chunk.

A primary disadvantage of a chunked HTTP protocol is that there is increased latency as two or three chunks (or more for higher latency connections) need to be buffered to insure a smooth viewer experience. This makes chunked HTTP protocols unsuitable for real-time interactions like video conferencing, but does not materially detract from their use for one directional live video delivery.

Thus, chunked HTTP video protocols like HTTP Live Streaming (HLS) from Apple, Inc., Microsoft® Smooth Streaming, Adobe® HDS, and MPEG Dynamic Adaptive Streaming over HTTP (DASH) have become dominant as compared to full streaming protocols like RTMP and RTSP, which have become relegated to special use cases such as real-time streams and camera encoding.

As mentioned above, MPEG TS UDP multicasting has several disadvantages, several of which we will describe now. On the global Internet, video delivery via unicast has shifted to be predominantly based on chunked HTTP protocols. These must then be converted into MPEG TS format, a cumbersome process. There is not a commercial or open source offering to do this conversion. Instead, vendors have focused on providing a second primary stream in a non-chunked true streaming format (typically RTMP). This is undesirable as well because there is not a widely deployed Internet content delivery supporting true streaming formats, limiting scalability and increasing expense.

In addition, there are not many video players that support receiving MPEG TS. Formerly, Microsoft® Silverlight can be used as a platform for implementing an MPEG TS player, but Microsoft® Silverlight has not been supported for many years. A custom purpose built player can be written, but it would need to be supported and maintained whereas players for the chunked protocols are widely available. Phone/tablet support is particularly challenging, requiring a full custom purpose built player.

Moreover, MPEG TS, originally conceived decades ago for satellite television (TV), does not support strong encryption for content protection.

Some vendors, e.g. Adobe, Inc., have implemented their own proprietary alternative for multicast video delivery. The primary drawback there is that the entire delivery and consumption chain needs to be implemented with support for the proprietary protocol.

The present invention is directed towards an approach to using multicast with a chunked HTTP protocol. In the description that follows, focus is on HTTP Live Streaming (HLS). However, the principles of present invention may be applied to other chunked HTTP protocols, such as HDS, MPEG DASH and Smooth Streaming.

As shown in FIG. 1, an exemplary corporate network 10 includes a content data network (CDN) 15. In general, a CDN is a system of distributed servers that deliver webpages and other Web content to a user based on the geographic locations of the user, the origin of the webpage and a content delivery server.

The CDN 15 is connected to a HTTP server 20. In general, a HTTP server is a computer system that processes requests via HTTP, the basic network protocol used to distribute information on the World Wide Web. As such, the HTTP server 20 includes at least a processor and memory.

The HTTP server 20 is connected to a HLS player 25 and a HLS multicast sender 30. In general, the HLS player enables a user on a personal computer, smartphone, tablet, and so forth, to view a continuous flow video.

The HLS multicast sender 30 is a computer device that receives HLS objects and transfers them by UDP multicast to a network device 35 and on one or more HLS multicast receivers 40, 45. Each HLS multicast receiver 40, 45 is connected to a HLS player 50, 55, respectively. In one embodiment, the HLS multicast receiver is resident within the HLS player 50, 55, replacing a need for the HLS multicast receivers 40, 45.

In the present invention, HLS (or other protocol) objects, e.g., a combination of .m3u8 playlist manifests and .ts chunk files in the case of HLS, are transferred by UDP multicast. The objects may be received directly from an output of an encoding/transcoding process, from a file storage location, from a cache on the CDN 15, from a local HTTP cache on the HTTP server 20 (e.g., Squid proxy server and web cache daemon), and so forth. On the HLS player 50, 55, or, as described above, on the HLS multicast receiver 40, 45, a receiver listens for the UDP multicast and recreates the objects making them available via HTTP, on disk, and so forth. The HLS player 50, 55 then accesses the objects from the receiver.

The process of the present invention, described above, includes several advantages. For example, the player accesses the objects in the same manner as if it were accessing remote objects delivered via unicast, so any player that supports HLS can be repointed to a local receiver and will work correctly. Thus, the built-in player on Apple® iOS or Android® functions without needing a custom player.

All of the advantages of the format, e.g., adaptive bit rate, can be preserved and made available. AES-128 encryption for security can be preserved. Any metadata embedded within the HLS chunks can also be preserved. Any associated additional objects can be easily accommodated, such as, for example, delivering a synchronized Microsoft® PowerPoint presentation with images can easily work with the present invention. Moreover, any future HTTP chunk based protocols can easily work with the present invention, providing future portability.

It should be noted that while there are some file-based multicasting implementations (e.g., UFTP), video presents one or more unique challenges that can only be overcome using the methods of the present invention.

For example, UDP is not a reliable protocol compared to TCP and network, packet corruption and in particular, packet loss, are expected to occur. A typical MPEG TS stream using the H.264 codec has the video divided into frames. Some of the frames are keyframes. Loss or corruption of frame(s) typically results in pixilation or video loss only until the next keyframe. And in the cases of pixilation, the lost data may be constrained to only a small portion of the image.

However, with a chunk-based protocol, a loss is likely to result in the entire chunk (which is typically 4 to 10 seconds) being unusable. A two way (explicit acknowledgment, or a negative acknowledgment) protocol can be implemented. With positive acknowledgments, there would be a lot of ACK traffic from potentially tens of thousands of viewers. Even with negative acknowledgments (e.g., retransmission requests), each network packet lost early in the distribution tree results in a storm of negative ACKs.

Instead, a forward error correction code, such as a code from the class of Reed-Solomon codes, can help reduce or eliminate data corruption. By class of Reed-Solomon codes, we intend to include both various parameters in defining the code and performance optimized variants such as Cauchy Reed-Solomon. Reed-Solomon codes are reasonably efficient for the number of errors desired to be correctable—they are actually optimal in the sense that they are maximum distance separable (MDS). In the description that follows, the focus is on Reed-Solomon codes. However, other error correcting codes, particularly erasure codes, can be used.

Reed-Solomon codes do not support data that are deleted. Reed-Solomon codes can correct for corruption but not for deletions. There are various extensions to Reed-Solomon codes, including certain Generalized Reed-Solomon codes, that can handle deletions. The present invention adheres to the basic Reed-Solomon code but applies it in two dimensions to accommodate correcting certain deletions.

Referring to FIG. 2, consider the string A B C encoded with a Reed-Solomon coding (where each letter is a codeword) that can recover from one error. Assume the encoded string is D E F G H. If any letter were corrupted, say D D F G H were received, the Reed-Solomon decoder will recover the original string A B C just fine. However, if a codeword were lost, say only D F G H were received, the decoder will not know whether this corresponded to _D F G H, D_F G H, and so forth.

Referring to FIG. 3, the present invention adds a sequence indicator (which may be a number or other ordinal indicator) to each Reed-Solomon encoded codeword. With the sequence numbers, it becomes apparent that sequence 2 was lost, so the string to be decoded is D_F G H.

Figure 4:
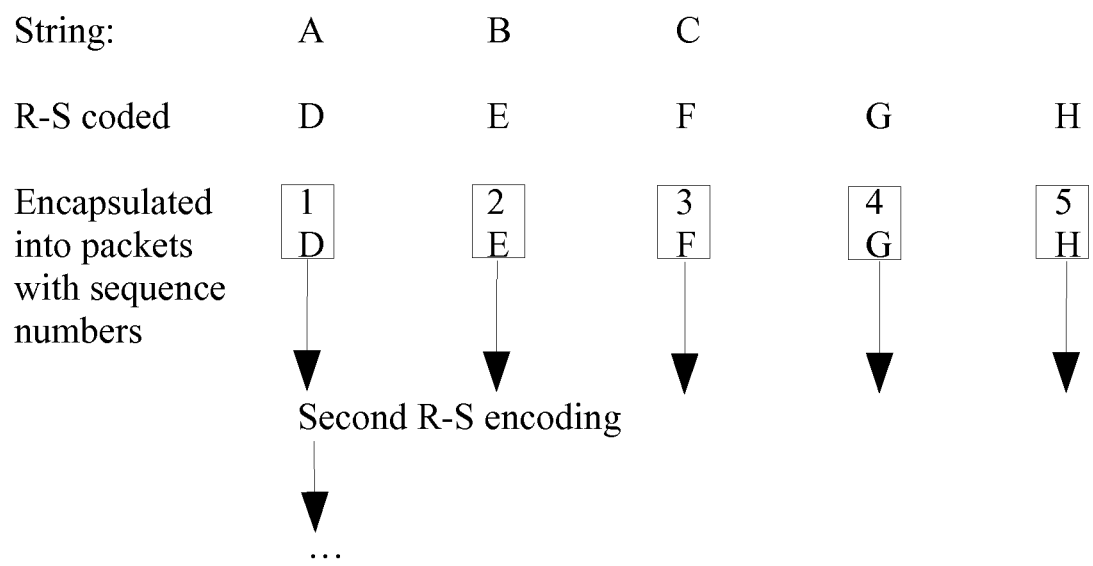
FIG. 4 is an exemplary table.

Referring to FIG. 4, one remaining issue is how to know the sequence numbers are not themselves corrupted. The present invention Our solution is to in turn encapsulate the output Reed-Solomon codewords together with their sequence number into packets into a second coding. This encapsulation is referred to hereinafter as a "packet," unless otherwise qualified, and refers to this encapsulation (instead of an IP packet or some other type of packet).

Figure 5:
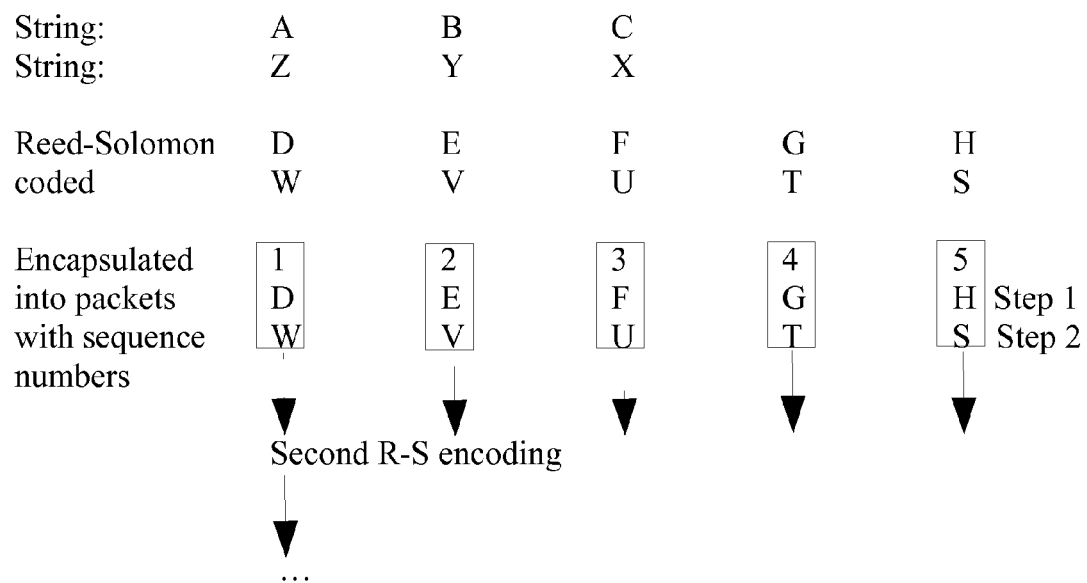
FIG. 5 is an exemplary table.

Referring to FIG. 5, to minimize the overhead of the second Reed-Solomon coding process, in one embodiment the present invention incorporates multiple first-encoding outputs into each packet. As used herein, we refer to this as a two-dimensional encoding and we refer to each first pass encoded output as a stripe. Note that two-dimensional encoding can, but does not necessarily require, more than one stripe or error correction coding in the first pass. Typically more than one stripe is used to improve network efficiency. More details on omitting error correction in the second pass will be described below. Two dimensional encoding bears some semblance to, but is more general, than the interleaver used in compact disc (CD) encoding (c.f. section 5.8 of Essentials of Error-Control Coding, J. C. Moreira and P. G. Farrell, John Wiley & Sons, 2006)

While basic forward error correction can handle dropped packets, in the event of a network interruption on a high speed network, multiple packets may be lost in a row. To help mitigate this, the present invention enables global retransmission, e.g., each packet is resent some number of times with fixed or variable delays. The delays then determine the duration of network interruption that can be tolerated. Because HLS (and other chunk based protocols) has natural buffering, a slight delay (usually up to the duration of at least one chunk) is acceptable to the player. The retransmission can be identified by the receiver due to the replicated sequence number.

The two passes of Reed-Solomon coding protect against two slightly different error cases. The first pass helps primarily to recover from lost packets, which are fairly common with UDP transmissions. The sequence numbers help in insuring proper sequential ordering (as UDP does not guarantee the order received matches the order transmitted) and time delays can be used to detect lost packets. The second pass is to insure the integrity of each packet—in the event a packet cannot be recovered, it can typically be treated as a lost packet. Only if too many packets are lost (since the R-S code selected determines the number of recoverable errors) does the receiver need to wait for a global retransmission. Thus, this is one optimization—not to wait for a global retransmission when treating as a lost packet still permits correct Reed-Solomon decoding. The second optimization is that as packet corruption is less likely than packet loss, a lower error correction capacity can be used for the second pass encoding. Lower error correction capacities result in more efficient codes. In the extreme case, the second pass may include a special case of a correction code that only detects errors, as opposed to correcting errors, as a packet corruption can be treated as a packet loss. To detect corruption, we can include an error check such as a cyclic redundancy code or a hash for the second pass instead of traditional error correction coding.

Error correction protocol in the present invention transmits octets of data over UDP reliably. To improve UDP performance, there is general guidance towards keeping each UDP datagram size under 512 bytes as the minimum MTU for IP is 576 bytes, so including overhead for IPv4 header, UDP headers, and so forth, 512 bytes is a general guideline for maximum UDP performance. Given the dominance of Ethernet, most networks today actually support an MTU of 1500 by default. Thus, keeping datagrams at a length of approximate 1436 bytes (to allow for overhead) is another design possibility. Given that octets are 8 bits, selecting a Reed-Solomon code GF(2) generator polynomial of order 8 for the first pass encoding makes sense as the codewords support exactly 8 bits, improving the performance of octet to codeword (and vice-versa) conversions. Coincidentally, if we use the same generator polynomial encoding for the second pass, we have packets that fit into UDP datagrams under 256 bytes in size, well below the 512 byte limit. Selecting a higher order generator polynomial can reduce the overhead of each packet (e.g., due to sequence numbers, and so forth), but results in performance loss in the octet/codeword conversion process. Thus, an order 8 generator polynomial makes sense for any passes requiring error correction.

With the order 8 polynomial as described previously, the data fall into natural blocks of somewhere just short of 255×255 bytes (short due to overhead for sequence numbers, and so forth). At one layer above the error correction coding layer, the actual data from the HLS chunks are encoded into blocks for transmission (and accordingly decoded on the receiving end). To help with distinguishing blocks belonging to different files, a unique identifier (a nonce) can be added separately or as part of the sequence number.

One observation is that a chunk is typically several seconds (e.g., 4 to 10 seconds are common values) in duration. Thus the nature of the sending process will be bursty. As each chunk becomes available, a burst of data becomes available, followed by nothing. With UDP transmissions, dropping data when resources are unavailable, either along the network or at the receiver, is the most common cause of packet loss. Thus one optimization is to spread out the sending of the chunk's corresponding packets via UDP. In practice, this results in an over 10× improvement in loss rates with older equipment. Even with relatively modern equipment, several times improvement can be seen.

Since the present invention deals with HLS and knows the format of its manifests (.m3u8 playlists), in an embodiment, this knowledge can be used to optimize handling and provide for added error recovery. For example, we can choose to send just the chunks along with metadata and reconstruct the manifests on the receiver end. This allows for a reduced resource consumption on the receiver end (e.g., consisting only the most recent 15 minutes of DVR whereas the sender end may have many hours of DVR) and also error recoveries such as replacing a lost chunk with a blank screen (or even simply skipping it). Similarly we can choose to send and/or receive only a subset of the bitrates available.

Various embodiments may be implemented using hardware elements, software elements, or a combination of both. Examples of hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some embodiments may comprise an article of manufacture. An article of manufacture may comprise a storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
in a corporate network comprising at least a first server comprising a processor and a memory, the first server linked to a computing system having a video player, receiving an output of a chunked video protocol in the first server;
sending the output from the first server via a multicast to a receiver, the multicast spreading a transmission to reduce irrecoverable data loss and enhance error correction, the multicast comprising an error correction code and a sequence indicator to recover lost data, the lost data recovery using a two dimensional encoding that uses error correction codes, possibly different, for each pass, to accommodate correcting certain deletions; and
in the receiver, processing the output to enable consumption by the video player.

2. The method of claim 1 wherein the chunked video protocol is HTTP Live Streaming (HLS).

3. The method of claim 1 wherein the chunked video protocol is MPEG Dynamic Adaptive Streaming over HTTP (DASH).

4. The method of claim 1 wherein the chunked video protocol includes encryption.

5. The method of claim 1 wherein the multicast uses User Datagram Protocol (UDP).

6. The method of claim 1 wherein the receiver is resident within a second server.

7. The method of claim 1 wherein the receiver is resident on the same computing system as the video player.

8. The method of claim 1 wherein the computing system is selected from the group consisting of a personal computer, a tablet computer and a smartphone.

9. The method of claim 1 wherein an interaction between the receiver and the video player uses a protocol selected from the group consisting of HTTP and HTTPS.

10. The method of claim 1 wherein the error correction code is a Reed-Solomon class code.

11. The method of claim 10 wherein the Reed-Solomon code uses an order 8 generator polynomial.

12. The method of claim 1 wherein global retransmission is used.

13. The method of claim 1 wherein the receiver uses time delays to detect lost packets.

14. The method of claim 1 wherein the receiver treats corrupted packets as lost packets.

15. The method of claim 1 wherein the sequence indicator includes a nonce is used.

16. The method of claim 1 wherein the receiver constructs a reduced resource consumption version of the video objects.

17. The method of claim 1 wherein the receiver constructs a version of the video objects skipping or substituting for chunks not properly received.

* * * * *